United States Patent

Hirokawa et al.

[11] Patent Number: 5,608,223
[45] Date of Patent: Mar. 4, 1997

[54] ION IMPLANTATION DEVICE

[75] Inventors: Suguru Hirokawa, Saijyou, Japan; Frank Sinclair, Quincy, Mass.

[73] Assignee: Eaton Corporation, Cleveland, Ohio

[21] Appl. No.: 458,354

[22] Filed: Jun. 2, 1995

[30] Foreign Application Priority Data

Jun. 10, 1994 [JP] Japan ................................. 6-129319

[51] Int. Cl.$^6$ ............................. G21K 5/10; H01J 37/317
[52] U.S. Cl. ............................. 250/447.11; 250/492.21
[58] Field of Search .................. 250/442.11, 492.21, 250/398

[56] References Cited

U.S. PATENT DOCUMENTS

| | | | |
|---|---|---|---|
| 3,778,626 | 11/1973 | Robertson | 250/492.21 |
| 4,234,797 | 11/1980 | Ryding . | |
| 4,517,465 | 5/1985 | Gault et al. | 250/492.2 |
| 4,628,209 | 9/1986 | Wittkower | 250/492.21 |
| 4,672,210 | 6/1987 | Armstrong et al. | 250/492.2 |
| 4,733,091 | 3/1988 | Robinson et al. | 250/442.11 |
| 4,775,796 | 10/1988 | Purser et al. | 250/492.21 |
| 5,046,148 | 9/1991 | Nogami et al. | 250/492.2 |
| 5,432,352 | 7/1995 | Van Bavel | 250/492.21 |
| 5,525,807 | 6/1996 | Hirokawa et al. | 250/492.21 |

FOREIGN PATENT DOCUMENTS

| | | |
|---|---|---|
| 0458422 | 11/1991 | European Pat. Off. . |
| 6116746 | 4/1994 | Japan . |
| 9113457 | 5/1991 | WIPO . |

OTHER PUBLICATIONS

Patent Abstracts of Japan, vol. 7 No. 182 (E–192)[1327], 11 Aug. 1983 JP–A–58 087746 (Nippon Denki) 25 May 1983.
Family Search Results for Japanese published application.

Primary Examiner—Bruce C. Anderson
Attorney, Agent, or Firm—Watts, Hoffmann, Fisher & Heinke

[57] ABSTRACT

An ion implantation device is equipped with a high-speed driving device which causes rotation of a disk that supports semiconductor wafers around its outer periphery. A center position of the disk is the axis of the high-speed rotation. A low-speed driving device causes relative movement of the disk in a radial direction. The ion implantation device calculates the movement speed of the low-speed driving device with reference to different spacings between wafers about the outer periphery and the distance from the center of the disk to the ion implantation position and controls the low speed scan speed so that ions are uniformly implanted into the wafers.

11 Claims, 4 Drawing Sheets

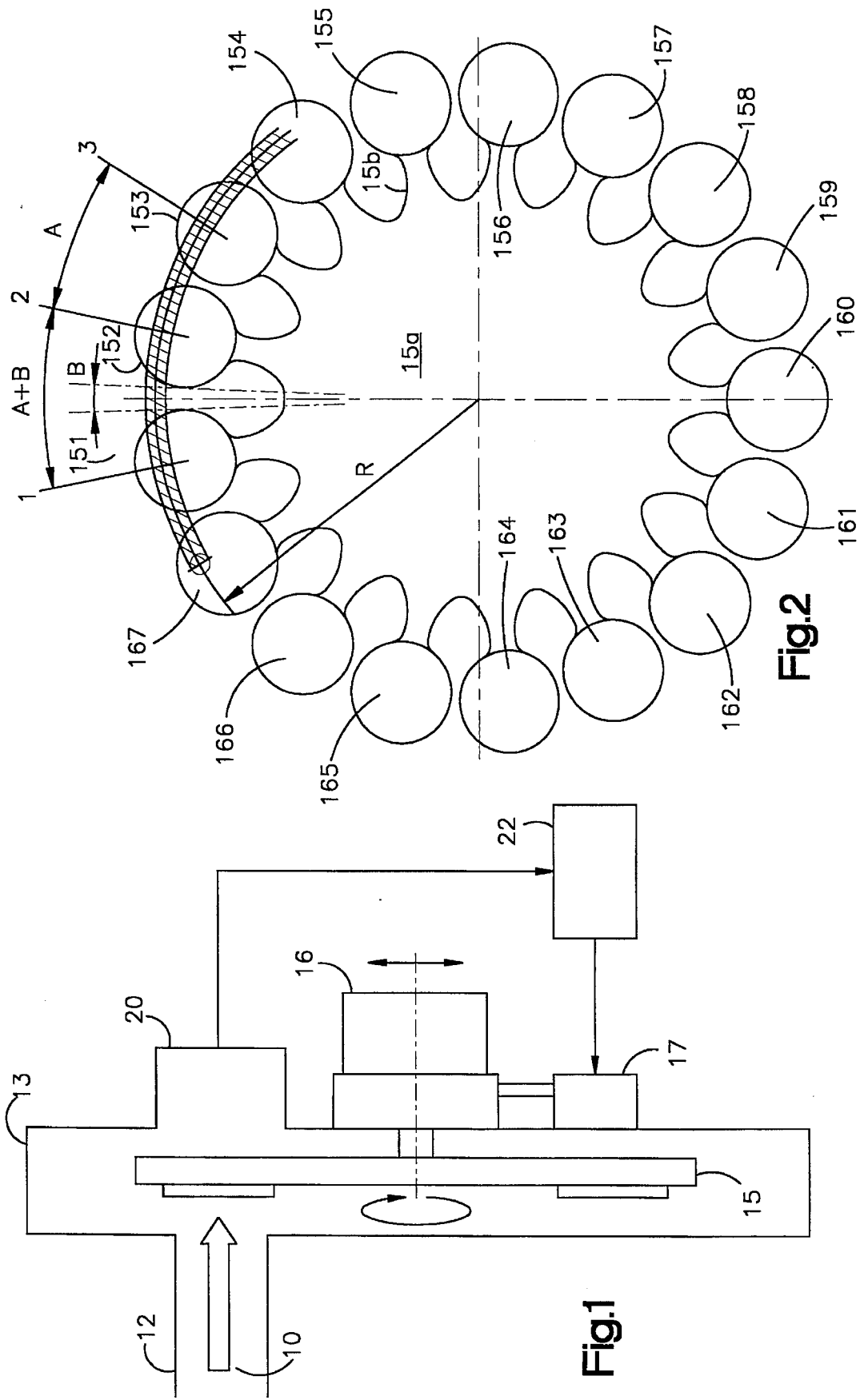

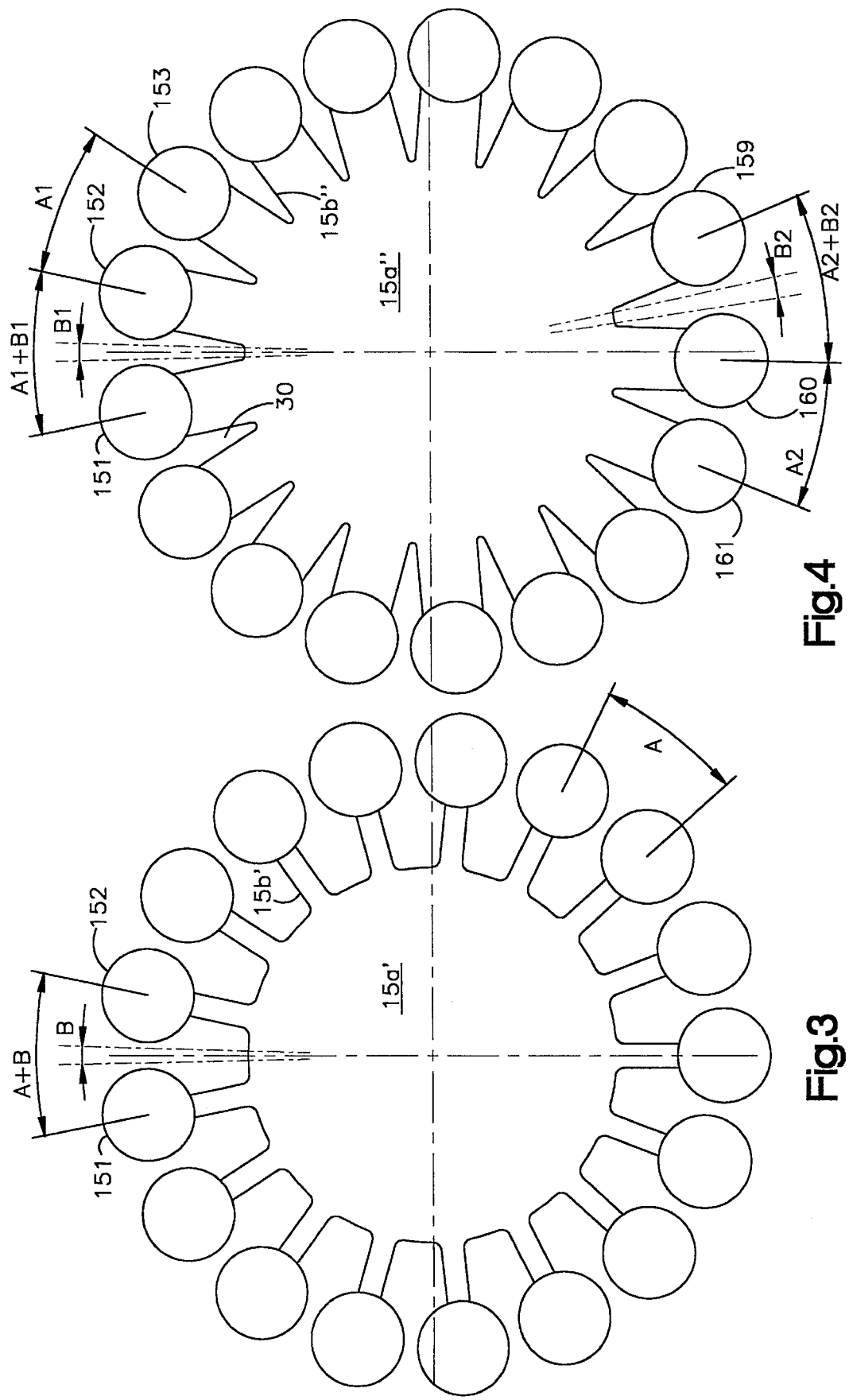

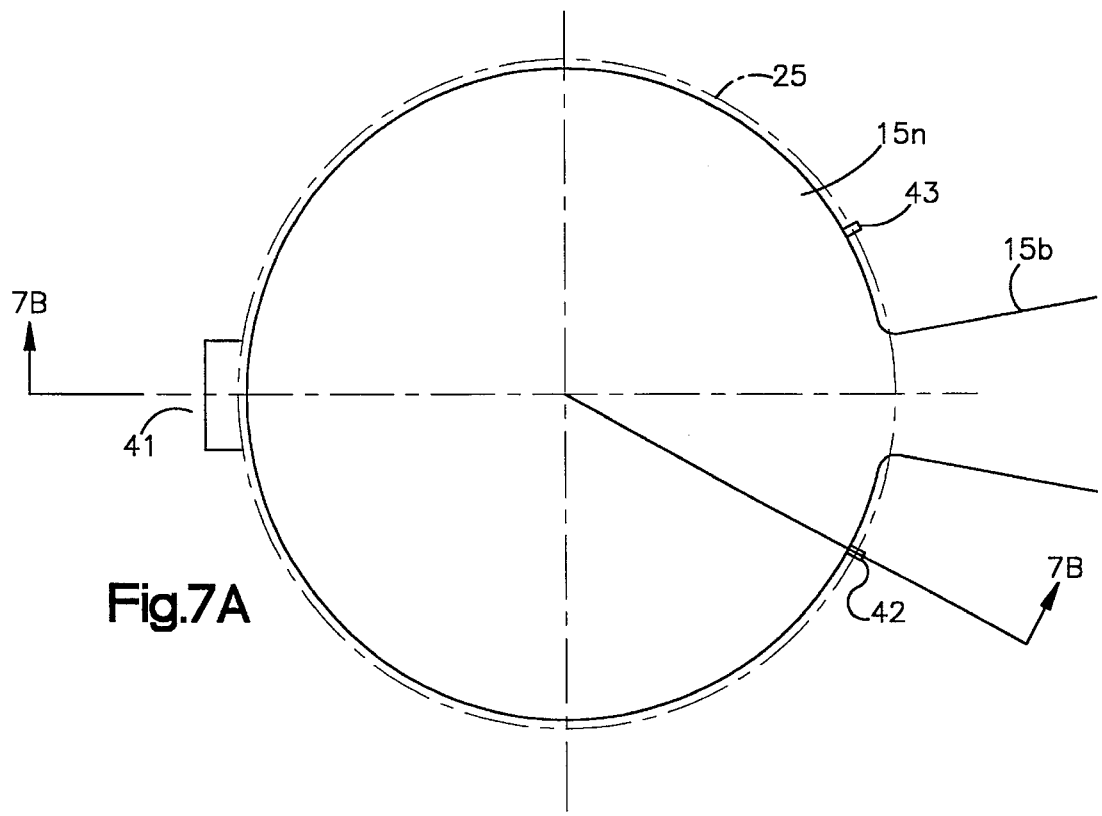
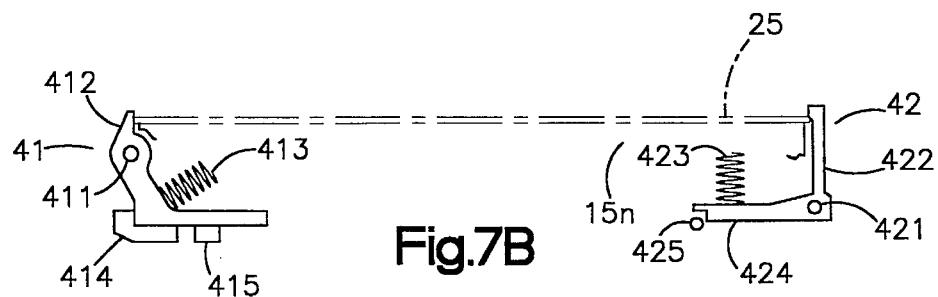

ION IMPLANTATION DEVICE

FIELD OF THE INVENTION

The present invention concerns an ion implantation device which implants charged particles, especially ions, into substrates such as semiconductor wafers.

BACKGROUND ART

Generally, ion implantation devices of this type are used to implant ions of a predetermined chemical species into semiconductor wafers in semiconductor manufacturing processes. Furthermore, such ion implantation devices include ion implantation devices with a so-called "mechanical scanning system" in which implantation is efficiently performed by a) positioning a multiple number of semiconductor wafers around the circumference of a rotation disk, b) causing said disk to rotate so that all of the semiconductor wafers are scanned at a high speed, and c) causing relative movement of the ion beam at a comparatively low speed in the radial direction of the rotating disk, so that the individual semiconductor wafers are scanned at a low speed.

Recently, in ion implantation devices, there has been a demand for an increase in the ion beam current in order to improve the productivity of semiconductor devices by shortening the ion implantation time. Hopes have been place in the abovementioned ion implantation devices with mechanical scanning systems as ion implantation devices capable of handling such large-current ion beams.

However, in cases where a large-current ion beam is used, particles of impurities are created by sputtering which occurs as a result of parts other than the semiconductor wafers (e.g., the rotating disk) being irradiated by the ion beam. These impurity particles become mixed with the desired ions, and adhere to the semiconductor wafers, so that said semiconductor wafers become contaminated (below, this will be referred to as "contamination"). When impurity elements other than the desired ions thus become mixed with said ions and adhere to the wafers, the yield of semiconductor devices drops conspicuously.

Furthermore, it has also been indicated that in cases where the chemical species of ions being implanted is changed after certain ions have been implanted, contamination caused by the element previously being implanted (i.e., cross contamination) occurs.

Various methods have been proposed in order to prevent such contamination or cross contamination. For example, in Japanese Patent Application Kokai No. 61-116746, an ion implantation device is disclosed in which contamination caused by sputtering of the rotating disk is prevented by constructing a scanning arm assembly in which wafer attachment paddles are installed at equal intervals in a circular arrangement around a central hub, and wafers are attached to the tips of said paddles. This ion implantation device is constructed so that the scanning arm assembly is caused to rotate at high speed, and so that a cycloidal movement is performed at a low speed about the axis of the bottom part of the scanning arm assembly.

In such a construction, since wafer attachment paddles are installed as a disk, the portions of said paddles that are exposed to the ion beam can be reduced, so that the portions of the disk exposed to the ion beam can be greatly reduced; furthermore, as a result of the aforementioned cycloidal movement, the entire surface of each wafer can be irradiated with the/on beam.

However, in the abovementioned ion implantation device using wafer attachment paddles, although the speed of the aforementioned cycloidal movement is controlled so that said speed is proportional to the distance from the axis of rotation, no consideration is given to fluctuations where there are changes in the ion beam current during the aforementioned low-speed cycloidal movement, the device cannot adequately respond to said changes; as a result, ions cannot be uniformly implanted.

One object of the present invention is to provide an ion implantation device a) which can reduce sputtering caused by exposure of the disk to the ion beam, and b) which can adequately respond to changes in the ion beam current during ion beam implantation.

DISCLOSURE OF THE INVENTION

The present invention provides an ion implantation device which is characterized by the fact that in an ion implantation device equipped with a disk which allows a plurality of wafers to be positioned at intervals around the circumference of said disk, said disk is constructed so that there is at least one place on said disk where the spacing between the aforementioned wafers is different from the spacing elsewhere.

In the above construction, respective ion beam charges passing between the wafers (which are separated from each other by different spacing) are successively compared over time, so that fluctuations in the ion beam current are detected. Furthermore, the speed of the aforementioned low-speed scanning in the radial direction of the disk with respect to the axis of rotation is controlled so that even if there are fluctuations in the ion beam current during ion beam implantation, ions can be implanted into the respective semiconductor wafers in a substantially uniform manner.

BRIEF DESCRIPTION OF THE DRAWINGS

FIG. 1 is a schematic diagram which illustrates the overall construction of the ion implantation device of the present invention;

FIG. 2 is a plan view which illustrates the disk used (in one embodiment of the present invention) in the ion implantation device shown in FIG. 1;

FIG. 3 is a plan view which illustrates a modification of the disk shown in FIG. 2;

FIG. 4 is a plan view which illustrates the disk used in another embodiment of the present invention;

FIG. 7A is a plan view which illustrates one of the semiconductor wafer attachment parts used in the present invention; and FIG. 7B is a sectional view as seen from the plane B—B of FIG. 7A.

BEST MODE FOR PRACTICING THE INVENTION

Figure 6:
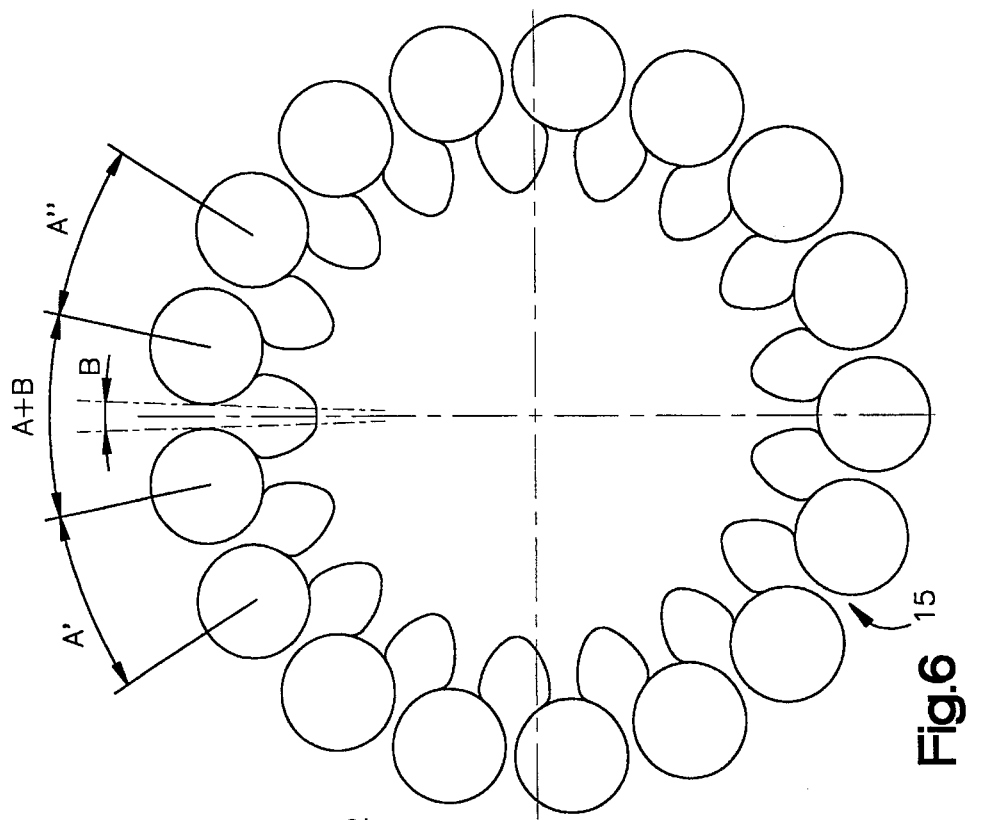
FIG. 6 is a plan view which illustrates the disk used in still another embodiment of the present invention.

Below, an ion implantation device constituting one embodiment of the present invention will be described with reference to the attached figures. Referring to FIG. 1, the ion implantation device of this embodiment has a guide chamber 12 which guides an ion beam 10 from an ion source (not shown in the figures), and a treatment chamber 13 in which the ion beam 10 from the guide chamber 12 is implanted into semiconductor wafers.

A disk 15 constructed according to the present invention (described in detail later) is installed inside the treatment chamber 13 shown in the figures. This disk 15 is caused to rotate at a high speed about a rotating shaft (installed at the center of said disk 15) by a high speed scanning driving mechanism 16. As a result of this rotation, the semiconductor wafers positioned around the circumference of the disk 15 are scanned at a high speed; furthermore, said wafers are also scanned at a low speed in the vertical direction in FIG. 1. Accordingly, a low-speed scanning driving mechanism 17 is installed so that the individual semiconductor wafers can also be scanned at a low speed in the radial direction from the axis of rotation. Here, a mechanism whose low-speed scanning operation can be controlled is used as the aforementioned low-speed scanning driving mechanism; meanwhile, the driving mechanism used for high-speed scanning may be an ordinary driving mechanism.

A beam current measuring device 20 is positioned behind the disk 15 installed in the treatment chamber 13 (i.e., on the opposite side of said disk from the side irradiated by the ion beam), and the charge of the ion beam passing through the disk 15 is measured by this beam current measuring device 20. Since this beam current measuring device 20 may consist of a commonly used device, a detailed description of said device 20 is omitted here.

The abovementioned beam current measuring device 20 is connected to a control part 22; this control part 22 performs predetermined calculations based on the charge detected, and controls the scanning speed of the low-speed scanning driving mechanism 17 so that ions are uniformly implanted.

Referring now to FIG. 2 as well, a multiple number of semiconductor wafer attachment parts 151–167 used for wafer attachment, i.e., 17 wafer attachment parts in the case of this embodiment (hereafter referred to collectively as 15n, are installed around the outside circumference of the disk 15 in the present embodiment, and respective semiconductor wafers are placed on each of these attachment parts 15n. Furthermore, the central part 15a of the disk 15 and the semiconductor wafer attachment parts 15n, are connected by bridge parts 15b which have a narrower width than the semiconductor wafer attachment parts 15n, so that the area of the disk 15 that is exposed to the ion beam is reduced.

Furthermore, in the example shown in the figures, the spacing between the semiconductor wafer attachment parts 151, 152 is set so that it is wider than the respective spacings between the other attachment parts (e.g. 152, 153). This means that the spacing between the semiconductor wafers attached to the attachment parts 151, 152 is wider than the respective spacings between the semiconductor wafers attached to the other attachment parts. Here, the conditions other than the aforementioned spacing, i.e. the wafer size and method of support, etc. are the same for all of the wafer attachment parts.

In the case of a disk 15 constructed as described above, the bridge parts 15b are extremely narrow; accordingly, the area exposed to the ion beam is small, so that contamination caused by exposure of the disk 15 to the ion beam can be greatly reduced.

Meanwhile, the angle between the center of the attachment part 151 and the center of the attachment part 152 can be expressed as A+B, where A is the angle between the center of the attachment part 152 and the center of the adjacent attachment part 153, and B is the angle of a space between the attachment parts 151, 152.

In this case, assuming that the center of the ion beam is located at a distance of R from the center of the disk 15, the area indicated by shading in FIG. 2 is irradiated by the ion beam. Accordingly, the charge measured by the beam current measuring device 20 installed on the downstream side of the disk 15 while the center of the ion beam passes from the center position 1 of the attachment part 151 to the center position 2 of the attachment part 152 is measured as the charge of the ion beam passing through the gap (i.e., the spacing) between the attachment parts 151, 152. Here, the charge measured by the beam current measuring device 20 is designated as QA+B.

Next, when the charge occurring while the center of the ion beam passes from the center position 2 of the attachment part 152 to the center position 3 of the attachment part 153 is similarly measured by the beam current measuring device 120, said charge is measured as the charge passing through the gap that defines the spacing of the attachment parts 152, 153. The charge measured in this case is designated as QA.

It is seen that the charge of the beam passing through the fan-shaped portion with an angle of B can be determined by calculating QA+B−QA under the conditions described above. This means that changes in the ion beam current during ion implantation can be detected; consequently, the charge of the ions implanted into the semiconductor wafers 25 attached to the respective attachment parts 15n can be maintained at a substantially constant level by controlling the speed of movement of the disk 15 in the radial direction, i.e., the scanning speed, in accordance with the aforementioned changes. More concretely, where V is the aforementioned speed of movement in the radial direction, said movement speed V can be expressed as V=K(QA+B−QA)/R (here, K is a proportionality constant). If the movement speed V is calculated by the control part 22 (shown in FIG. 1) using this formula, and the low-speed scanning driving mechanism is controlled in accordance with the result obtained, ions can be uniformly implanted.

It is sufficient if the abovementioned charge measurement and control action are performed for each revolution of the disk. In such a case, any discrepancies in timing are cancelled.

Referring to FIG. 3, the disk 15 in a modification of the embodiment shown in FIG. 1 differs from the disk shown in FIG. 2 in that the center part 15a' of the disk and the attachment parts 15n are connected by rectangular bridge parts 15b'. As in FIG. 2, two of the attachment parts installed in specified positions (attachment parts 151, 152 in FIG. 3) are positioned with a spacing of angle B; as a result, the angle between the center positions of these specified attachment parts 151, 152 can be expressed as A+B, and thus different from the angle A between the center positions of the other attachment parts.

In this case, as in the case of FIG. 2, the portion of the disk 15 that is exposed to the ion beam can be minimized; furthermore, the speed of movement of the disk 15 in the radial direction, i.e., the scanning speed, can be adjusted in accordance with changes in the ion beam current so that ions are uniformly implanted into the semiconductor wafers attached to the attachment parts 15n.

Referring to FIG. 4, the disk in another embodiment of the present invention is constructed so that adjacent attachment parts 15n are separated from each other by notches (i.e., valleys) 30, with a stipulated spacing between each pair of adjacent attachment parts 15n. Here, the spacing between attachment parts 15n is substantially the same as the spacing between the semiconductor wafers. In this example, the bridge parts 15b'' which connect the attachment parts 15n with the central part 15a'' of the disk have a tapered shape which becomes slightly wider toward the central part 15a'' of the disk.

In FIG. 4, the angular spacing determined by the notch between the attachment parts 151, 152 is set at B1, and the angular spacing determined by the notch between the attachment parts 159, 160 is set at B2. Meanwhile, the angular spacing between the remaining attachment parts is set at a value which is smaller than the aforementioned angular spacings B1, B2.

Furthermore, in a case where the angle between the center position of the attachment part 152 and the center position of the adjacent attachment part 153 is set at A1, and the angle between the center position of the attachment part 160 and the center position of the adjacent attachment part 161 is set to A2, the angle between the attachment parts 151, 152 can be expressed as A1+B1, and the angle between the attachment parts 159, 160 can be expressed as A2+B2.

In this case, as in the case of FIG. 2, the charges for the angles (A1+B1) and (A2+B2) can be expressed as the ion beam charges QA1+B1 and QA2+B2 passing through the respective notches. Accordingly, the scanning speed V at various locations in the radial direction can be expressed as follows (in a case where the ion beam is located at a position of radius R):

$$V+K(QAN+BN-QAN)/R \qquad (eq\ 1.)$$

(Here, N indicates 1 or 2) As is also clear from the above equation, two or more notches with different angular spacings may be formed. Furthermore, the mean value of the charge may be used for the control of the scanning speed V.

Figure 5:
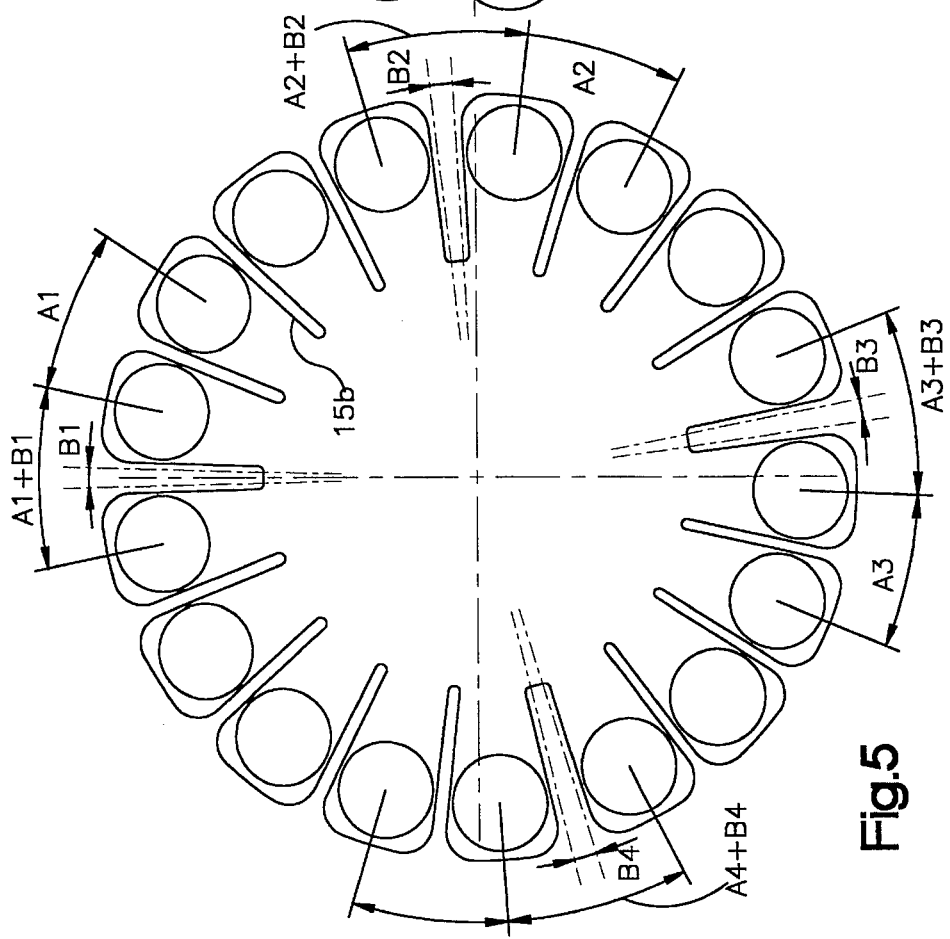
FIG. 5 is a plan view which illustrates the disk used in still another embodiment of the present invention.

Referring to FIG. 5, the disk 15 in still another embodiment of the present invention has wide notches in four places, and has tapered bridge parts 15b that widen outward in the radial direction from the central part of the disk. Furthermore, these bridge parts 15b are formed as integral units with the attachment parts 15n, and semiconductor wafers 25 are placed on said attachment parts 15n. Here, the spacings between the centers of the attachment parts adjacent to the respective wide notches are expressed by the angles A1, A2, A3 and A4. Assuming that the four notches have respective angles of B1, B2, B3, and B4, the spacings between the centers of the respective attachment parts located on either side of the wide notches can be expressed by the angles (A1+B1), (A2+B2), (A3+B3) and (A4+B4). The aforementioned equation 1 is also valid in this example; accordingly, ions can be uniformly implanted into the semiconductor wafers 25 by controlling the scanning speed V.

Referring to FIG. 6, a wide notch which has an angle of B, and ordinary notches which have angles smaller than that of the wide notch, are formed in the disk 15 of still another embodiment of the present invention. In this case, the scanning speed V can be controlled using the following equation (where A is the angle between the semiconductor wafers on either side of the ordinary notches, A+B is the angle between the semiconductor wafers on either side of the wide notch, and QA(R−ΔR), QA(R+ΔR) and QA+B(R) are the charges passing through the respective notches);

$$V=K(QA+B(R)-(QA(R-\Delta R)+QA(R+\Delta R))/2)/R \qquad (Eq\ 2.)$$

As is clear from Equation 2 as well, the shift (ΔR) in the radial position caused by low-speed scanning (which is ordinarily ignored) can be considered by subtracting the mean value of the charges passing through adjacent notches from the charge passing through the wide notch, so that ions can be implanted into the respective semiconductor wafers 25 more accurately.

FIGS. 7A and 7B illustrate the construction of a clamping part used to support the semiconductor wafers on the disks of the respective embodiments of the present invention described above. As is clear from FIG. 7A, a first clamp 41 which supports the semiconductor wafer 25 against the centrifugal force caused by rotation is installed only the outer circumference of each attachment part, and second and third clamps 42, 43 are installed on the inner circumference. Here, the second and third clamps 42, 43 have the same structure; accordingly, on the second clamp 42 will be described below. As is shown in FIG. 7B, the first clamp 41 has a rotation shaft 411 which is fastened to the attachment part 15n, and a fastening pawl 412 which extends upward from the rotating shaft 411. This fastening pawl 412 contacts the circumference of the semiconductor wafer 25, and supports the wafer 25 so that said wafer 25 is not pushed outward by centrifugal force. Furthermore, the portion of the first clamp 41 that extends downward is fastened to the attachment part by a compression spring 413, so that said spring 413 drives the first clamp 41 in the clockwise direction in FIG. 7B. Moreover, a weight 414 is attached to the portion of the first clamp 41 that extends horizontally, and a stopper 415 is installed in front of the weight 414.

Meanwhile, in the case of the second clamp 42, there is no need to consider the effects of centrifugal force. Accordingly, this clamp 42 has a simplified structure compared to that of the first clamp 41. Here, said clamp 42 is equipped with a moveable member 422 which can rotate about a rotating shaft 421 supported on the attachment part 15n, and an arm 424 which is attached to the attachment part 15n by a compression spring 423. A stopper 425 is installed at the inside edge part of the arm 424; this stopper 425 prevents the arm 424 from pivoting into an undesired position when no wafer 25 is attached.

The semiconductor wafer 25 is retained from the sides by the first through third clamps constructed as described above, so that said semiconductor wafer 25 is clamped to the surface of the attachment part 15n.

In the present invention, a disk which allows a plurality of wafers to be positioned at a prescribed spacing around the circumference of said disk is constructed so that there is at least one place on said disk where the spacing between wafers in different from the spacing elsewhere. As a result, the area of the disk that is exposed to the ion beam is reduced, and contamination caused by undesired sputtering can be prevented. Furthermore, fluctuations in the ion beam current are detected from the ion beam charges passing through the aforementioned areas with different spacing, and the rate of low-speed scanning is controlled in accordance with these detection results, so that ions can be uniformly implanted into the semiconductor wafers.

We claim:

1. A method for use with an ion implantation system, the method comprising the steps of:

a) positioning a plurality of wafers at spaced distances from one another around a circumference of a support disk, the support disk defining spacings that pass through the support disk between adjacent pairs of the positioned wafers such that the spacing between one adjacent pair of the positioned wafers is wider along the circumference of the support disk than the spacing between another adjacent pair of the positioned wafers;

b) rotating the support disk about an axis with respect to the ion beam such that the ion beam scans each positioned wafer and passes the support disk through the spacings between the positioned wafers;

c) detecting charge of the ion beam as the ion beam passes through the spacings between the positioned wafers while the support disk is rotating;

d) determining changes in the detected ion beam charge; and e) controlling a radial scan of the positioned wafers with the ion beam based on the determined changes in ion beam charge.

2. The method of claim 1, wherein the controlling step (e) comprises the step of moving the support disk with respect to the ion beam such that the ion beam scans the positioned wafers in a radial direction from the axis of rotation of the support disk.

3. The method of claim 1, wherein the controlling step (e) comprises the step of controlling the speed of the radial scan based on the determined changes in ion beam charge, the circumferential widths of the spacings between the positioned wafers, and the radial distance between the ion beam and the axis of rotation of the support disk.

4. The method of claim 1, wherein the positioning step (a) comprises the step of positioning the wafers at spaced distances from one another around the circumference of the support disk such that at least two spacings between adjacent pairs of the positioned wafers are each wider along the circumference of the support disk than any other spacing between an adjacent pair of the positioned wafers.

5. The method of claim 1, wherein the method performs the determining step (d) and the controlling step (e) for each revolution of the support disk.

6. An apparatus for use in an ion implantation system, the apparatus comprising:

a) a support disk for supporting a plurality of wafers positioned at spaced distances from one another around a circumference of the support disk, the support disk defining spacings that pass through the support disk between adjacent pairs of the positioned wafers such that the spacing between one adjacent pair of the positioned wafers is wider along the circumference of the support disk than the spacing between another adjacent pair of the positioned wafers;

b) a rotation drive mechanism for rotating the support disk about an axis with respect to the ion beam such that the ion beam scans each positioned wafer and passes the support disk through the spacings between the positioned wafers;

c) a charge detection device for detecting charge of the ion beam as the ion beam passes through the spacings between the positioned wafers while the support disk is rotating;

d) a radial drive mechanism for radially scanning the positioned wafers with the ion beam; and e) a controller for determining changes in the detected ion beam charge and for controlling the radial scan of the positioned wafers based on the determined changes in ion beam charge.

7. The apparatus of claim 6, wherein the radial drive mechanism moves the support disk with respect to the ion beam such that the ion beam scans the positioned wafers in a radial direction from the axis of rotation of the support disk.

8. The apparatus of claim 6, wherein the controller controls the speed of the radial scan based on the determined changes in ion beam charge, the circumferential widths of the spacings between the positioned wafers, and the radial distance between the ion beam and the axis of rotation of the support disk.

9. The apparatus of claim 6, wherein the support disk supports the positioned wafers at spaced distances from one another around the circumference of the support disk such that at least two spacings between adjacent pairs of the positioned wafers are each wider along the circumference of the support disk than any other spacing between an adjacent pair of the positioned wafers.

10. The apparatus of claim 6, wherein the controller determines changes in ion beam charge and controls the radial scan of the positioned wafers for each revolution of the support disk.

11. The apparatus of claim 6, wherein the support disk supports each wafer with a wafer attachment portion coupled by a bridge to a central portion of the support disk.

* * * * *